United States Patent
Curtis et al.

(10) Patent No.: US 8,754,524 B2
(45) Date of Patent: *Jun. 17, 2014

(54) WAFER-LEVEL INTERCONNECT FOR HIGH MECHANICAL RELIABILITY APPLICATIONS

(75) Inventors: Anthony Curtis, Gilbert, AZ (US); Guy F. Burgess, Gilbert, AZ (US); Michael Johnson, Tempe, AZ (US); Ted Tessier, Chandler, AZ (US); Yuan Lu, Phoenix, AZ (US)

(73) Assignee: FlipChip International, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/397,876

(22) Filed: Feb. 16, 2012

(65) Prior Publication Data

US 2012/0146219 A1 Jun. 14, 2012

Related U.S. Application Data

(63) Continuation of application No. 11/867,646, filed on Oct. 4, 2007, now Pat. No. 8,143,722.

(60) Provisional application No. 60/849,657, filed on Oct. 5, 2006.

(51) Int. Cl.
*H01L 23/48* (2006.01)

(52) U.S. Cl.
USPC ........... 257/738; 257/772; 257/778; 257/779; 257/E23.021; 257/E23.069; 257/E21.508

(58) Field of Classification Search
USPC .................... 257/772, 779, E23.015, E23.02, 257/E23.023–E23.079, E21.508, E21.509, 257/E21.519
See application file for complete search history.

(56) References Cited

U.S. PATENT DOCUMENTS

| | | | |
|---|---|---|---|
| 6,360,939 | B1 | 3/2002 | Paruchuri et al. |
| 6,413,851 | B1 | 7/2002 | Chow et al. |
| 6,703,069 | B1 | 3/2004 | Moon et al. |
| 6,819,002 | B2 | 11/2004 | Chen et al. |
| 6,969,915 | B2 | 11/2005 | Tago et al. |
| 8,143,722 | B2 * | 3/2012 | Curtis et al. ............ 257/738 |
| 2002/0093096 | A1 | 7/2002 | Tago et al. |
| 2007/0158391 | A1 | 7/2007 | Son et al. |
| 2008/0083986 | A1 | 4/2008 | Curtis et al. |

FOREIGN PATENT DOCUMENTS

| | | |
|---|---|---|
| EP | 1223613 | 7/2002 |
| GB | 2346380 | 8/2000 |
| JP | 2003230980 | 8/2003 |
| TW | 527675 | 4/2003 |

(Continued)

OTHER PUBLICATIONS

European Patent Application No. 07873520.6, Communication pursuant to Article 94(3), Jan. 19, 2012.

(Continued)

*Primary Examiner* — Jasmine Clark
(74) *Attorney, Agent, or Firm* — Greenberg Traurig, LLP

(57) ABSTRACT

An interconnect structure comprises a solder including nickel (Ni) in a range of 0.01 to 0.20 percent by weight. The interconnect structure further includes an intermetallic compound (IMC) layer in contact with the solder. The IMC layer comprises a compound of copper and nickel.

16 Claims, 2 Drawing Sheets

(56) References Cited

FOREIGN PATENT DOCUMENTS

| | | |
|---|---|---|
| WO | 9921226 | 4/1999 |
| WO | 2006059115 | 6/2006 |
| WO | 2008118913 | 10/2008 |

OTHER PUBLICATIONS

European Patent Application No. 07873520.6, Communication pursuant to Article 94(3), Jun. 1, 2010.

European Patent Application No. 07873520.6, Communication pursuant to Article 94(3), Oct. 27, 2010.

European Patent Application No. 07873520.6, Extended Search Report, Mar. 17, 2010.

Garner, L. et al., "Finding Solutions to the Challenges in Package Interconnect Reliability," Intel Technology Journal, vol. 9, No. 4, Nov. 9, 2005, pp. 297-308.

International Patent Application No. PCT/US2007/080558, International Search Report, Sep. 2, 2008.

International Patent Application No. PCT/US2007/080558, Written Opinion, Sep. 2, 2008.

Syed, A. et al., "Alloying Effect of Ni, Co, and Sb in SAC solder for Improved Drop Performance of Chip Scale Packages with Cu OSP Pad Finish," Electronics Packaging Technology Conference 2006, EPTC '06, 8th, IEEE, PI, Dec. 6-8, 2006, pp. 404-411.

Tanaka, M. et al., "Improvement in Drop Shock Reliability of Sn—1.2Ag—0.5Cu BGA Interconnects by Ni Addition," Electronic Components and Technology Conference 2006, San Diego, May 30-Jun. 2, 2006, IEEE, pp. 78-84.

Translation of Official Communication for related Taiwan Patent Application No. 96137172, May 9, 2011, including as attachment, translation of Search Report.

Xia, Y et al., "Coupling effects at Cu(Ni)—SnAgCu—Cu(Ni) sandwich solder joint during isothermal aging," Journal of Alloys and Compounds, Elsevier Sequoia, Lausanne, CH, vol. 417, No. 102, Jun. 29, 2006, pp. 143-149.

Terashima, et al., "Thermal Fatigue Properties of Sn—1.2Ag—0.5Cu-xNi Flip Chip Interconnects" Materials Transaction, vol. 45, No. 3, Dec. 31, 2004, pp. 681-688.

* cited by examiner

WAFER-LEVEL INTERCONNECT FOR HIGH MECHANICAL RELIABILITY APPLICATIONS

CROSS REFERENCE TO RELATED APPLICATIONS

The present application is a continuation of U.S. patent application Ser. No. 11/867,646, filed Oct. 4, 2007, and entitled "Wafer-Level Interconnect for High Mechanical Reliability Applications," which claims the benefit of provisional U.S. Pat. App. Ser. No. 60/849,657, filed Oct. 5, 2006, and entitled "Wafer-Level Interconnect for High Mechanical Reliability Applications," the disclosures of which applications are hereby incorporated herein by reference.

FIELD

The present disclosure generally relates to a structure and method for semiconductor devices, and more particularly to a structure and method for electronic wafer-level chip-scale packaging and flip-chip packaging and assembly.

BACKGROUND

There has been a long-standing desire in the electronics packaging industry to improve the mechanical performance of lead (Pb)-free solders, which are used in both wafer-level chip-scale packaging and flip-chip devices. Prior efforts have included the trace addition or doping with various elements such as, for example, Co and Zn. Prior efforts also include studies on the influence of doping (e.g., with Ti, Fe, Co, Pt, In and Ni) on the mechanical properties of Pb-free solders.

One problem observed in existing interconnect structures is premature interconnect failure due to an individual, combination or series of mechanical damaging events such as drop shock, vibration, and shear. Prior attempts to solve this problem and increase joint mechanical strength have included the use of Pb-free solders having a lower Young's modulus and hardness to help reduce brittle interconnect fracture by making the solder more compliant (e.g., indium-based Pb-free solders, Sn—Cu Pb-free solders, or Sn—Ag—Cu alloys having lower levels of silver). These prior attempts have not satisfactorily eliminated premature interconnect failure.

Accordingly, it would be desirable to have improved joint mechanical strength when using solders to manufacture wafer-level chip-scale packages or flip-chip devices.

BRIEF DESCRIPTION OF THE DRAWINGS

For a more complete understanding of the present disclosure, reference is now made to the following figures, wherein like reference numbers refer to similar items throughout the figures.

Figure 1:
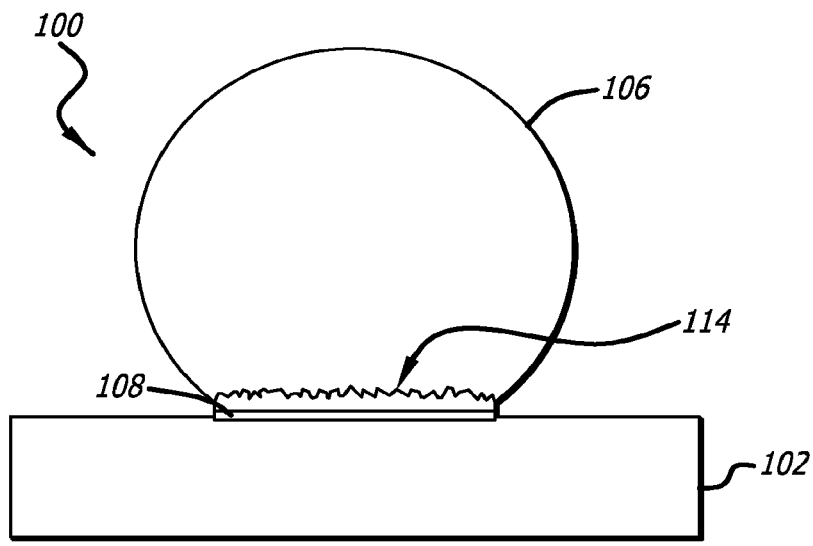
FIG. 1 illustrates a cross-sectional view of a portion of a wafer-level chip-scale or flip-chip package prior to assembly to a substrate according to an exemplary embodiment of the present disclosure.

The exemplification set out herein illustrates particular embodiments, and such exemplification is not intended to be construed as limiting in any manner.

DETAILED DESCRIPTION

The following description and the drawings illustrate specific embodiments sufficiently to enable those skilled in the art to practice the systems and methods described herein. Other embodiments may incorporate structural, logical, process and other changes. Examples merely typify possible variations.

The elements that implement the various embodiments of the present structure and method are described below. Many elements may be configured using well-known structures. It should also be understood that the techniques of the present structure and method might be implemented using a variety of technologies.

This invention generally relates to an improved interconnect structure using a solder alloy containing a relatively small proportion of Ni. The improved structure typically provides improved joint mechanical strength for long term mechanical reliability for, for example, Pb-free solder used to produce wafer-level chip-scale packages (CSP) or flip-chip interconnects. In one embodiment, a 0.01 to 0.20 percent by weight (wt %) Ni-enhanced Pb-free solder alloy is used. For example, the Pb-free solder alloy preferably consists essentially of Sn—Ag—Cu and 0.01 to 0.20 wt % Ni. The Sn, Ag, and Cu generally may be used in conventional proportions.

The solder alloy may be, for example, reflowed and attached to an under bump metal, which for example, may be formed as a vacuum-deposited thin film or a plated film. Other conventional manufacturing methods may be used to manufacture the interconnect structure as described below.

The combination of a Ni-enhanced Pb-free alloy with an under-bump-metallurgy (UBM) is believed to generally provide improved joint mechanical strength by controlling the intermetallic formations at the solder/UBM interface and at the Sn grain boundaries (inter-dendrites) within the bulk solder. This has been observed in improved high speed shear condition and validated through drop testing results by the inventors as compared to the same structure using a non-Ni-enhanced Pb-free alloy. This improvement in joint strength will be of benefit for electronic devices that use wafer-level CSP or flip-chip interconnects where the device is prone to be dropped, in particular for mobile items such as cell phones, personal digital assistants, MP3 players, game players, etc.

More specific embodiments of structures that may implement the Ni-enhanced solder alloy interconnect structure are now discussed in greater detail below. In a first embodiment, solder is used to form an interconnect between two different substrates. The interconnect typically includes a bulk solder component, and an intermetallic compound (IMC) at the interface(s) of the bulk solder and the metal structure (e.g., UBM) on the wafer. The IMC is formed by a metallurgical reaction between the solder and the UBM.

A UBM is generally classified as either a thin film or thick film. A thin film UBM is typically produced by vacuum deposition (such as sputter deposition or evaporation). A thick film UBM is typically produced by plating. An example of a suitable UBM structure is aluminum-nickel(vanadium)-copper with copper contacting the solder. Other possible alternatives include, but are not limited to, the following alloys: Ti/NiV/Cu, Ti/Ni/Cu, TiW/Cu, TiW/Ni/Cu, TiW/NiV/Cu, Cr/Ni/Cu or Cr/NiV/Cu. Examples of a suitable thick film UBM may be formed using the following: Cu, NiP/Au, NiP/NiPd/Au, PdP/Au, PdP, Ni/Au, or Cu/Ni/Au.

The joint strength of the interconnect is dependent on the ductility (compliance) of the bulk solder and the joint mechanical strength of the IMC at the solder/UBM interface. Although increased reliability is desired in the interconnect structure, the interfacial IMC itself is considered to be fairly brittle.

It is believed that the improved joint mechanical performance of Pb-free solder interconnects is aided by one or a combination of the following: improving the bulk solder micro-structure properties, improving the compatibility of the UBM structure (e.g. UBM film stress level or solubility) with the intended IMC structure, and by improving control of the interfacial IMC growth and evolution.

Improvements attained by using bulk solder for wafer-level CSP and flip-chip interconnects with the above solder alloy interconnects were observed by utilizing known high speed shear and high speed cold ball pull testing to simulate mechanical drop impact events. The testing included utilization of a wide range of test condition parameters (e.g., impact shear, pull speed, and impact shear height) to gauge the scale of the improvements attained by use of the Ni-enhanced solder. Additional testing using a known drop test apparatus tested the drop test reliability of structures made with the Ni-enhanced solder, which performed significantly better than available alternatives. Testing also included the compatibility of various UBM options with an emphasis on overall film stress level and soluble metal thickness.

FIG. 1 illustrates a cross-sectional view of a portion of a wafer-level chip-scale or flip-chip package 100 prior to assembly to a substrate. A wafer device 102 (e.g., a typical integrated circuit (IC) die) is provided for subsequent connection to a substrate (see FIG. 2). A UBM 108, formed on wafer device 102, is in contact with bulk solder 106 (e.g., a solder bump or ball) at interfacial IMC 114. In an actual package, there would typically be a large number of solder bumps or balls used.

Figure 2:
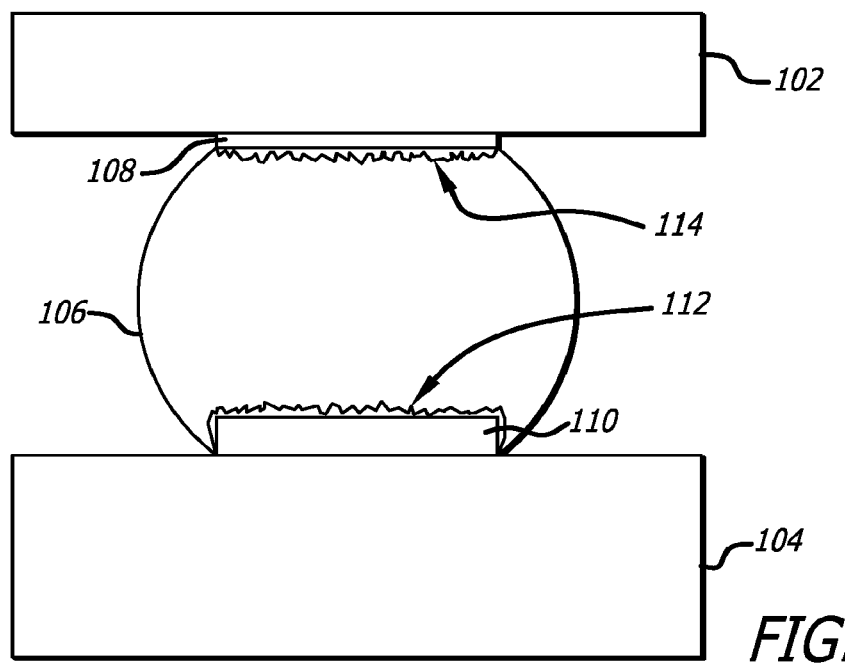
FIG. 2 illustrates an assembled solder interconnect according to an exemplary embodiment of the present disclosure.

FIG. 2 illustrates a cross-sectional view of a portion of an assembled solder interconnect structure 200. Wafer device 102 is connected to a substrate 104 (e.g., a printed circuit board) using bulk solder 106.

A conventional metal finish or layer 110, which is conducive to solder adhesion, is formed on substrate 104, and is in contact with bulk solder 106 at interfacial IMC 112. Bulk solder 106 has a solder alloy composition as described herein. Metal finish 110 may, for example, have a top layer of copper similarly as the UBM. However, this is not always the case. If metal finish 110 has a copper finish, the thickness is typically significantly greater than that of the UBM on the wafer side. The Cu finish on the board 104 could range, for example, from about 2 to 5 microns (ums).

Various board 104 finishes may be used. For example, a common board finish is Cu with an organic layer on the surface to protect the Cu from oxidation, known as "Cu OSP". Other examples are NiP/Au, or Ag (sometimes called immersion silver).

Interfacial IMC 114 may have a thickness, for example, of less than about 2.0 microns (ums). UBM 108 may have a thickness, for example, of less than about 2.0 microns (ums). These thicknesses may vary significantly in other embodiments.

The interconnect structure and method described herein may be implemented, for example, in yet other types of chip-scale or wafer-level packages (e.g., chip-on-board assembly applications or in standard flip-chip package used in flip-chip package applications). Examples of such implementations are described in U.S. Pat. No. 6,441,487 (titled Chip Scale Package Using Large Ductile Solder Balls by Elenius et al. issued Aug. 27, 2002) and U.S. Pat. No. 5,844,304 (titled Process for Manufacturing Semiconductor Device and Semiconductor Wafer by Kata et al. issued Dec. 1, 1998), and U.S. Pat. No. 5,547,740 (titled Solderable Contacts for Flip Chip Integrated Circuit Devices by Higdon et. al. issued Aug. 20, 1996) and U.S. Pat. No. 6,251,501 (titled Surface Mount Circuit Device and Solder Bumping Method Therefor by Higdon et al. issued Jun. 26, 2001), which are each hereby incorporated by reference at least for their teachings regarding packaging applications, structures and fabrication methods.

The interconnect structure itself is now discussed in more detail in specific examples. In one embodiment, a Pb-free solder alloy consists essentially of Sn—Ag—Cu and 0.01 to 0.20 wt % Ni. An example of the Pb-solder alloy would be 98.4% Sn—1.0% Ag—0.5% Cu—0.1% Ni. As examples of the Sn—Ag—Cu composition, the Ag composition may be about 0.25 to 4.0 wt %, and the Cu about 0 to 2.0 wt %. The Sn composition may be, for example, about 99.75 to 94.5 wt %, or provide the balance of any of the above-listed compositions. As in any solder composition, there are usually trace elements present, which are minor and not expected to affect the properties of the interconnect structure when kept within conventional standards. The solder alloy may be, for example, in the form of either discrete solder spheres (i.e., solder balls) or a solder paste. The solder may be, for example, reflowed to a UBM produced using either a vacuum-deposited thin film or a plated film.

The use of the above solder alloy composition with a UBM is believed to aid in providing a smoother, thinner intermetallic thickness at the UBM/solder interface after solder reflow, which minimizes the heterogeneous growth of this brittle interface. In a preferred embodiment, the top layer of the UBM is copper, which reacts with the bulk solder. More specifically, in a preferred embodiment, most of the Cu in the top surface of the UBM forms into the intermetallic (IMC) layer during the reflow processes, which exposes the boundary Ni layer in the UBM. In contrast, if the UBM is only a relatively thick copper layer, it will never be fully consumed at any point in the processing or interface.

In addition, the use of the structure above is believed to provide a lower level of intermetallics within the inter-dendritic bonding area surrounding the Sn grain boundaries within the bulk solder after solder reflow. This assists in making the bulk solder more compliant than the non-Ni-doped alloy. In one embodiment, the UBM structure has a limited amount of Cu due to the thin film requirements required by some in the packaging industry. This is in contrast to use of merely a thick film of plated Cu, which would not be adequate to meet UBM production packaging requirements. The UBM in the preferred embodiments has other thin film metal layers such as NiV. Sufficient copper should be used in the top layer of the UBM to form the IMC to the smoothness that is desired. For example, the minimum thickness for the Cu layer in the UBM should be about 7,000 Angstroms. In the preferred embodiment, the Cu in the UBM reacts with the Ni in the solder to form the smooth IMC layer. The Ni in the UBM may also contribute to IMC formation to some degree.

In other embodiments, different combinations of metal structures in the UBM will react with the solder and contribute to the formation of the IMC layer and its characteristics. For example, in a NiP-based UBM, the Ni in the UBM may react with the Sn in the solder instead of the Cu to form the smooth IMC layer.

Within the desired Ni doping ranges described herein, it was observed that the interfacial IMC thickness was thinner than for the same non-Ni doped alloy. It was further observed that the smoother micro-structure of the interfacial IMC was more desirable than a jagged, scalloped micro-structure common in Pb-free alloys without Ni. The smoother micro-structure allows for uniform stress in the IMC. The jagged, scalloped micro-structure has areas of higher stress states since the structure is not as homogeneous at the smoother micro-structure.

Figure 4:
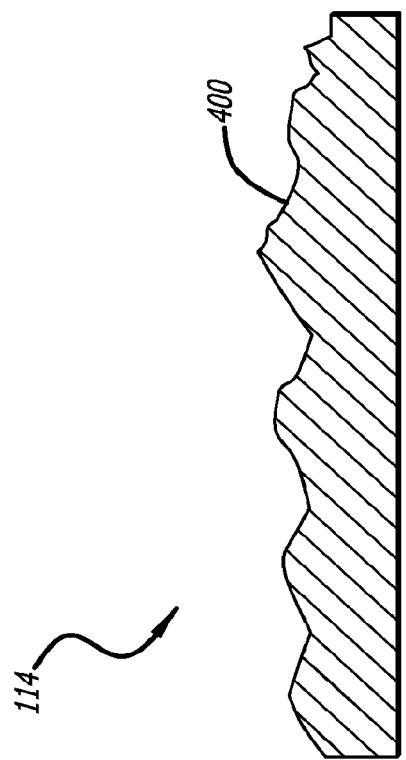
FIG. 4 illustrates an interfacial IMC morphology with Ni doping according to an exemplary embodiment of the present disclosure.
Figure 3:
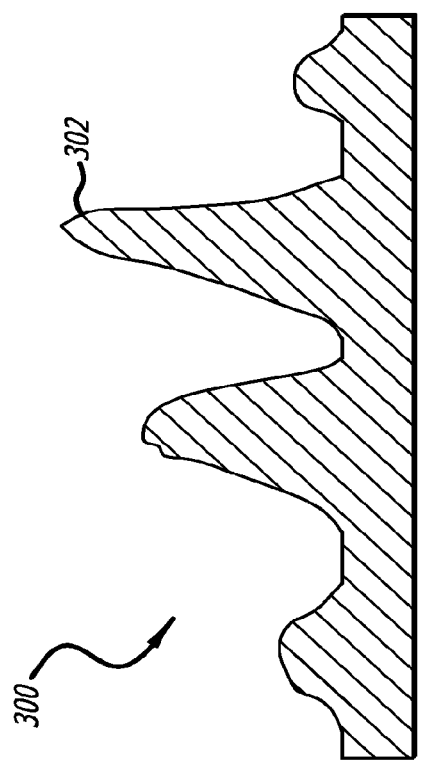
FIG. 3 illustrates an interfacial IMC morphology without Ni doping.

For example, FIG. 3 illustrates an interfacial IMC morphology 300 without Ni doping. Morphology 300 exhibits undesirable spikes 302. In contrast, FIG. 4 illustrates a morphology for interfacial IMC 114 with Ni doping as described above. The surface 400 of interfacial IMC 114 is substantially smooth when compared to IMCs without Ni doping.

Regarding manufacture of the interconnect structure itself, conventional wafer-level chip-scale and flip-chip processing may be used. For example, solder may be applied to the UBM, and reflowed with solder reaching the melt temperature to form a physical bond between the solder and the UBM.

In an alternative embodiment, a thick-film Cu UBM may be used. The Ni in the solder will react with the Cu during the reflow process to form a smooth interfacial IMC 114 layer (see FIG. 2).

By the foregoing disclosure, an improved interconnect structure and method have been described. The structure and method above typically provides the following advantages. Mechanical integrity is improved for both the compliance of the bulk solder and minimization of the heterogeneous growth and shape of the interfacial IMC thickness, which is the most brittle structure in the interconnect structure, through the use of Ni-doped Sn—Ag—Cu alloy solders. The overall structure is significantly more ductile than other available alternatives, increasing the ability of the structure to absorb otherwise damaging mechanical energy from events such as drop impact, vibration and shear.

The foregoing description of specific embodiments reveals the general nature of the disclosure sufficiently that others can, by applying current knowledge, readily modify and/or adapt it for various applications without departing from the generic concept. Therefore, such adaptations and modifications are within the meaning and range of equivalents of the disclosed embodiments. The phraseology or terminology employed herein is for the purpose of description and not of limitation.

What is claimed is:

1. An interconnect structure positioned between two electrical contacts including a first metal contact and a second metal contact, the interconnect structure comprising:
    a solder alloy comprising nickel (Ni) and tin (Sn), wherein the nickel (Ni) is in a range of 0.01 to 0.20 percent by weight (wt %); and
    an intermetallic compound (IMC) layer having a top surface in contact with the solder alloy and a bottom surface in contact with the first metal contact, the IMC layer comprising a compound of copper and nickel.

2. The interconnect structure of claim 1, wherein the interconnect structure is incorporated in a flip-chip package.

3. The interconnect structure of claim 1, wherein the first metal contact comprises nickel.

4. The interconnect structure of claim 1, wherein the solder alloy consists essentially of nickel (Ni), tin (Sn), silver (Ag), and copper (Cu).

5. The interconnect structure of claim 1, wherein the first metal contact and the second metal contact are each located on a respective substrate, and the respective substrate of the first metal contact is a semiconductor die comprising an integrated circuit electrically coupled to the second metal contact.

6. The interconnect structure of claim 1, wherein the first metal contact comprises a top layer comprising copper.

7. The interconnect structure of claim 6, wherein the first metal contact further comprises an intermediate layer underlying the top layer, and the intermediate layer comprises nickel.

8. The interconnect structure of claim 1, wherein the compound of copper and nickel promotes smoothness of the top surface of the IMC layer.

9. An interconnect structure, comprising:
    a semiconductor substrate comprising an integrated circuit;
    an under bump metallurgy (UBM) on the substrate, the UBM comprising nickel and the integrated circuit electrically coupled to the UBM;
    an intermetallic compound (IMC) layer on the UBM, the IMC layer comprising a compound of copper and nickel; and
    a bulk solder body on the IMC layer, the bulk solder body comprising nickel (Ni) and copper (Cu), wherein the nickel (Ni) is in a range of 0.01 to 0.20 percent by weight (wt %).

10. The interconnect structure of claim 9, wherein the bulk solder body comprises:
    greater than 94.5 percent by weight (wt %) tin (Sn);
    less than 4.0 percent by weight (wt %) silver (Ag); and
    less than 2.0 percent by weight (wt %) copper (Cu).

11. The interconnect structure of claim 9, wherein the bulk solder body comprises less than 2.0 percent by weight (wt %) of copper (Cu).

12. The interconnect structure of claim 9, wherein the under bump metallurgy (UBM) is a film having a top layer of copper and an underlying layer of nickel.

13. The interconnect structure of claim 9, wherein the IMC layer has a thickness of less than 2.0 microns.

14. The interconnect structure of claim 9, wherein the under bump metallurgy (UBM) is a film composed of one or more alloys selected from the group consisting of:
    aluminum (Al)-nickel vanadium (NiV)-copper (Cu);
    titanium (Ti)-nickel vanadium (NiV)-copper (Cu);
    titanium (Ti)-nickel (Ni)-copper (Cu);
    titanium tungsten (TiW)-copper (Cu);
    titanium tungsten (TiW)-nickel (Ni)-copper (Cu);
    titanium tungsten (TiW)-nickel vanadium (NiV)-copper (Cu);
    chromium (Cr)-nickel (Ni)-copper (Cu); and
    chromium (Cr)-nickel vanadium (NiV)-copper (Cu).

15. The interconnect structure of claim 9, wherein the UBM has a structure selected from the group consisting of:
    aluminum (Al)-nickel vanadium (NiV)-copper (Cu); and
    titanium (Ti)-nickel vanadium (NiV)-copper (Cu).

16. An interconnect structure positioned between two electrical contacts, the interconnect structure comprising:
    a solder alloy attached through an intermetallic compound (IMC) layer to an under bump metallurgy containing copper on a top surface, the under bump metallurgy being disposed between the two contacts, and the solder alloy comprising nickel (Ni), tin (Sn), silver (Ag), and copper (Cu);
    wherein the nickel (Ni) content is in a range of 0.01 to 0.20 percent by weight (wt %), and the IMC layer comprises a compound of copper and nickel.

* * * * *